(12) United States Patent
Wu et al.

(10) Patent No.: US 12,741,513 B2
(45) Date of Patent: Sep. 22, 2026

(54) VEHICLE WINDOW ASSEMBLY

(71) Applicant: AUO Corporation, Hsin-Chu (TW)

(72) Inventors: Shih-Chang Wu, Hsin-Chu (TW); Ting-Shih Hsu, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 329 days.

(21) Appl. No.: 18/389,828

(22) Filed: Dec. 20, 2023

(65) Prior Publication Data

US 2025/0206238 A1 Jun. 26, 2025

(51) Int. Cl.

| | |
|---|---|
| ***B60J 1/08*** | (2006.01) |
| ***B60R 11/02*** | (2006.01) |
| ***G02B 7/182*** | (2021.01) |
| ***H05K 5/06*** | (2006.01) |
| *B60J 1/00* | (2006.01) |
| *B60R 11/00* | (2006.01) |
| *G02B 7/198* | (2021.01) |

(52) U.S. Cl.
CPC ............. *B60J 1/08* (2013.01); *B60R 11/0235* (2013.01); *G02B 7/1822* (2013.01); *G02B 7/1825* (2013.01); *H05K 5/06* (2013.01); *B60J 1/001* (2013.01); *B60R 2011/0026* (2013.01); *G02B 7/198* (2013.01)

(58) Field of Classification Search
None
See application file for complete search history.

(56) References Cited

U.S. PATENT DOCUMENTS

2025/0081372 A1* 3/2025 Kim ......................... H05K 5/03

FOREIGN PATENT DOCUMENTS

| | | |
|---|---|---|
| CN | 206259138 U | 6/2017 |
| CN | 107719260 A | 2/2018 |
| CN | 210401665 U | 4/2020 |
| CN | 112606759 A | 4/2021 |
| CN | 112622753 A | 4/2021 |
| CN | 114220678 A | 3/2022 |
| CN | 115454281 A | 12/2022 |

* cited by examiner

*Primary Examiner* — Dung T Nguyen
(74) *Attorney, Agent, or Firm* — WPAT, PC

(57) ABSTRACT

A vehicle window assembly includes two glass cover plates, a display panel, at least one bracket and a waterproof case. The display panel includes a display component and a circuit board. The display component is positioned between the two glass cover plates. The circuit board is connected to the display component and is at least partially exposed outside the glass cover plates. The bracket fixedly clamps a lower edge of the glass cover plates. The waterproof case is fixedly attached to the bracket and includes two housing components. The two housing components are tightly combined and enclose the circuit board.

20 Claims, 6 Drawing Sheets

4-4'

51A
53
54
65
66
68
67
61
35
55
68
60
65
54
53
57(64)
E1
66

VEHICLE WINDOW ASSEMBLY

BACKGROUND

Technical Field

The present disclosure relates to a vehicle window assembly.

Description of Related Art

Automotive application of MicroLED display technology has begun to emerge lately. Accordingly, MicroLED display has to be adapted to meet the reliability requirements of automotive electronics.

SUMMARY

In view of the foregoing, one of the objects of the present disclosure is to provide a vehicle window assembly with an embedded display panel and being waterproof and vibration resistant.

To achieve the objective stated above, in accordance with an embodiment of the present disclosure, a vehicle window assembly includes two glass cover plates, a display panel, at least one bracket and a waterproof case. The display panel includes a display component and a circuit board. The display component is positioned between the two glass cover plates. The circuit board is connected to the display component and is at least partially exposed outside the two glass cover plates. The bracket fixedly clamps a lower edge of the two glass cover plates. The waterproof case is fixedly attached to the bracket and includes a first housing component and a second housing component. The first housing component and the second housing component are tightly combined and enclose the circuit board.

In one or more embodiments of the present disclosure, the first housing component and the second housing component each have an upper edge. The upper edge of the first housing component and the upper edge of the second housing component clamp the lower edge of the two glass cover plates.

In one or more embodiments of the present disclosure, the waterproof case further includes a first double-sided adhesive strip and a second double-sided adhesive strip, both of which are arranged along the lower edge of the two glass cover plates. The first double-sided adhesive strip adheres between the upper edge of the first housing component and the two glass cover plates. The second double-sided adhesive strip adheres between the upper edge of the second housing component and the two glass cover plates.

In one or more embodiments of the present disclosure, the waterproof case further includes a fastener. The second housing component is affixed to the first housing component by the fastener, such that the first double-sided adhesive strip is pressed between the first housing component and the two glass cover plates, and the second double-sided adhesive strip is pressed between the second housing component and the two glass cover plates.

In one or more embodiments of the present disclosure, the waterproof case further includes at least one waterproof sealing strip arranged along at least one lateral side of the first housing component. The waterproof sealing strip has two opposite surfaces abutting against the first housing component and the second housing component, respectively.

In one or more embodiments of the present disclosure, the waterproof case further includes a fastener. The fastener extends through the second housing component and the waterproof sealing strip, and the fastener is fixedly coupled to the first housing component.

In one or more embodiments of the present disclosure, the first housing component includes at least one partition wall. The partition wall is disposed on an inner side of the waterproof sealing strip and separates the waterproof sealing strip and the circuit board.

In one or more embodiments of the present disclosure, the partition wall has a sloping edge tilting away from the circuit board.

In one or more embodiments of the present disclosure, the waterproof sealing strip includes at least one double-sided adhesive strip.

In one or more embodiments of the present disclosure, the first housing component includes a backplate and a boss. The boss is disposed on the backplate and projects from the backplate. The vehicle window assembly further includes a fastener extending through the circuit board and fixing the circuit board to the boss.

In one or more embodiments of the present disclosure, a stiffness of the first housing component is greater than a stiffness of the second housing component, and the first housing component is affixed to the bracket.

In one or more embodiments of the present disclosure, the vehicle window assembly includes two brackets spaced apart from each other. The waterproof case is positioned between the two brackets and is fixedly attached to the two brackets.

In accordance with an embodiment of the present disclosure, a vehicle window assembly includes two glass cover plates, a display panel, two brackets and a waterproof case. The display panel includes a display component, a circuit board and a flexible circuit board. The display component is positioned between the two glass cover plates. The circuit board is connected to a lower edge of the display component via the flexible circuit board. The circuit board and the flexible circuit board are at least partially exposed outside the two glass cover plates. The two brackets fixedly clamp a lower edge of the two glass cover plates and are spaced apart from each other. The waterproof case is positioned between the two brackets and is fixedly attached to the two brackets. The waterproof case includes a first housing component and a second housing component. The first housing component and the second housing component are tightly combined and enclose the circuit board and the flexible circuit board. The first housing component and the second housing component each have an upper edge. The upper edge of the first housing component and the upper edge of the second housing component clamp the lower edge of the two glass cover plates.

In sum, the vehicle window assembly of the present disclosure includes a display panel to provide display function. The display panel is covered by two glass cover plates, and the display panel includes a circuit board exposed outside the glass cover plates and enclosed by a waterproof case. The waterproof case is supported by at least one bracket fixedly clamping a lower edge of the glass cover plates. By this arrangement, the vehicle window assembly of the present disclosure can be compliant with the waterproof requirement of automotive electronics. In addition, the circuit board can be fixed in the waterproof case to restrict the movement of the circuit board. Such can prevent a flexible circuit board connected to the circuit board from being damaged by vibrations that occur during vehicle operation.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

DETAILED DESCRIPTION

Figure 1:
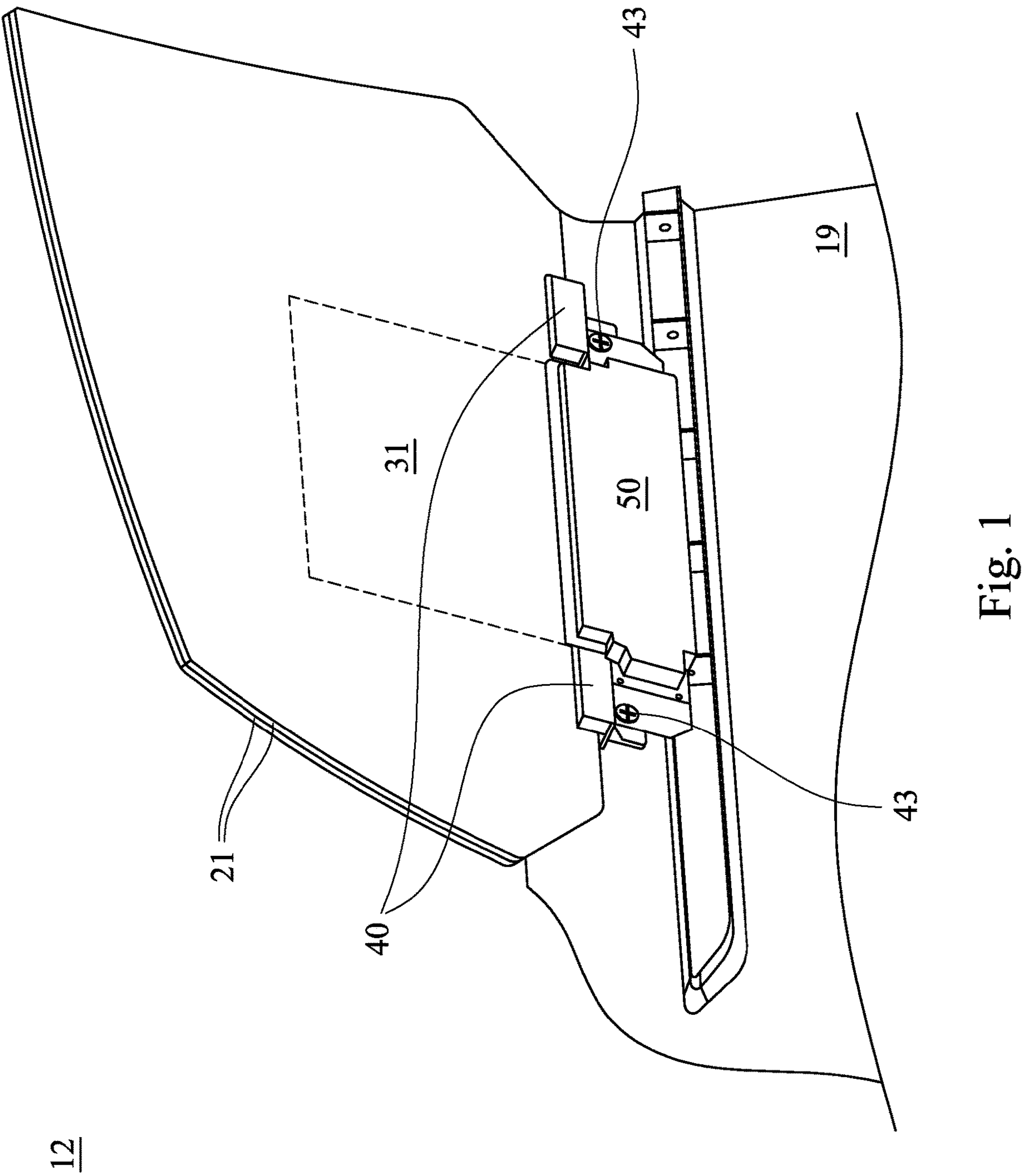
FIG. 1 illustrates an assembled view of a vehicle window assembly in accordance with an embodiment of the present disclosure.

For the completeness of the description of the present disclosure, reference is made to the accompanying drawings and the various embodiments described below. Various features in the drawings are not drawn to scale and are provided for illustration purposes only. To provide full understanding of the present disclosure, various practical details will be explained in the following descriptions. However, a person with an ordinary skill in relevant art should realize that the present disclosure can be implemented without one or more of the practical details. Therefore, the present disclosure is not to be limited by these details.

Figure 2:
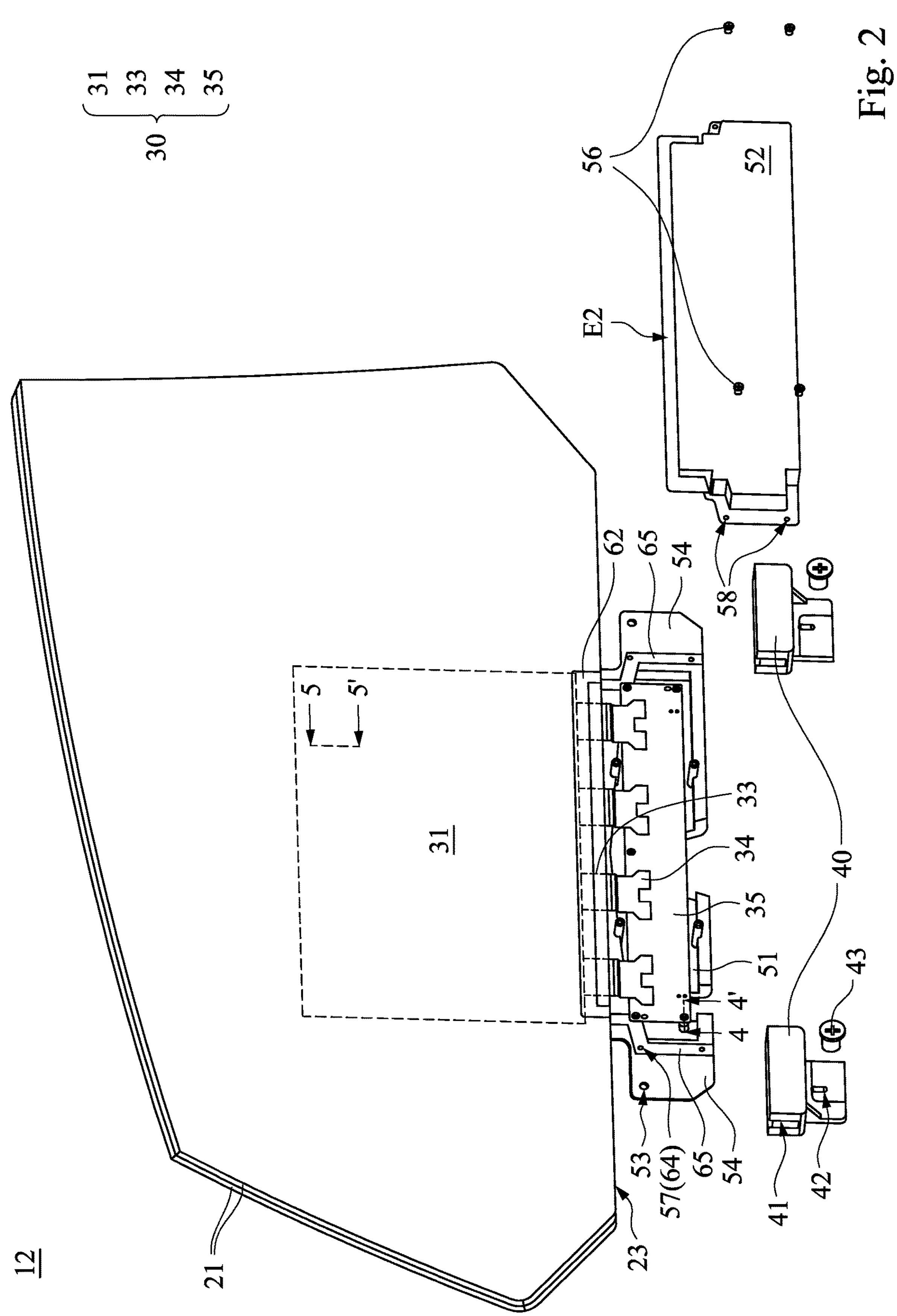
FIG. 2 illustrates an exploded view of the vehicle window assembly shown in FIG. 1.

Reference is made to FIGS. 1 and 2. FIG. 1 illustrates an assembled view of a vehicle window assembly 12 in accordance with an embodiment of the present disclosure. FIG. 2 illustrates an exploded view of the vehicle window assembly 12 shown in FIG. 1. The vehicle window assembly 12 is a vehicle window with display function, and the vehicle window assembly 12 can be mounted on a door 19 of a vehicle. The vehicle window assembly 12 includes two glass cover plates 21 and a display panel 30. The display panel 30 includes a display component 31 (shown in dashed lines) and a circuit board 35. The display component 31 is positioned between the two glass cover plates 21. The circuit board 35 is connected to an edge of the display component 31 and is at least partially exposed outside the two glass cover plates 21.

The display panel 30 of the vehicle window assembly 12 can be a micro light-emitting diode (microLED) display panel, or can be other types of display panels, such as an organic light-emitting diode (OLED) panel. The display component 31 of the display panel 30 may include a circuit substrate (e.g., a thin-film transistor (TFT) substrate) and a plurality of light-emitting devices disposed on the circuit substrate (e.g., a plurality of microLEDs arranged on the circuit substrate). The circuit board 35 is, for example, a control circuit board of the display component 31. The circuit board 35 is, for example, a rigid-type printed circuit board (PCB). The glass cover plates 21 may include curved glass cover plates or flat glass cover plates.

As shown in FIGS. 1 and 2, in the illustrated embodiment, the circuit board 35 is connected to a lower edge of the display component 31, and the circuit board 35 is located beneath the display component 31 and the glass cover plates 21. The circuit board 35 is electrically connected to the display component 31 via one or more display driver ICs 33 (shown in dotted lines) and one or more flexible circuit boards 34. The display driver ICs 33 are connected to the lower edge of the display component 31, and each of the flexible circuit boards 34 are connected between a respective display driver IC 33 and the circuit board 35.

As shown in FIGS. 1 and 2, the display drivers IC 33 may be in a form of chip-on-film (COF) package. Each COF package includes a flexible printed circuit (FPC) and a driver chip disposed on the FPC. The display driver ICs 33 can be partially or completely covered by the two glass cover plates 21. The flexible circuit boards 34 connected to the display driver ICs 33 can be at least partially exposed outside the two glass cover plates 21.

As shown in FIGS. 1 and 2, the vehicle window assembly 12 further includes at least one bracket 40 and a waterproof case 50. The glass cover plates 21 have a lower edge 23. The bracket 40 is fixedly attached to the lower edge 23 of the glass cover plates 21. In the present embodiment, the bracket 40 is fixedly attached to the glass cover plates 21 by fixedly clamping the lower edge 23 of the glass cover plates 21. For example, the bracket 40 has a groove 41. The glass cover plates 21 are inserted in the groove 41 of the bracket 40 and are therefore clamped by the bracket 40. The waterproof case 50 is fixedly attached to the bracket 40 and includes a first housing component 51 and a second housing component 52. The first housing component 51 and the second housing component 52 are tightly combined and enclose the circuit board 35 to protect the circuit board 35 from water. Specifically, the waterproof case 50 can prevent the water (e.g., rain) flowing down the glass cover plates 21 from contacting the circuit board 35 and causing short-circuiting of the circuit board 35. The flexible circuit boards 34 connected to the circuit board 35 may also be enclosed by the first housing component 51 and the second housing component 52 and are thus protected from water.

As shown in FIGS. 1 and 2, in some embodiments, the vehicle window assembly 12 includes two brackets 40. The two brackets 40 are arranged along the lower edge 23 of the glass cover plates 21 and are spaced apart from each other. The waterproof case 50 is positioned between the two brackets 40 and is fixedly attached to the two brackets 40. In some embodiments, the at least one bracket 40 may include a plastic material. In some embodiments, an adhesive may be injected into the groove 41 of the bracket 40 to make the bracket 40 and the glass cover plates 21 more firmly joined.

As shown in FIGS. 1 and 2, in some embodiments, a stiffness of the first housing component 51 is greater than a stiffness of the second housing component 52, and the first housing component 51 is affixed to the bracket 40. By this arrangement, the first housing component 51 can be firmly attached to the bracket 40 with low level of deformation. In some embodiments, the first housing component 51 has at least one through-hole 53, and the bracket 40 has at least one through-hole 42. The vehicle window assembly 12 further includes at least one fastener 43 (e.g., at least one screw) extending through the through-hole 53 of the first housing component 51 and fixedly inserted in the through-hole 42 of the bracket 40 (e.g., the through-hole 42 may include an internal thread that can mate with the fastener 43). In some embodiments, the first housing component 51 has at least one extension portion 54 that is not covered by the second housing component 52 and overlaps with the bracket 40. The through-hole 53 is provided at the extension portion 54.

In some embodiments, the first housing component 51 is a metal part (e.g., the first housing component 51 may include aluminum). In some embodiments, the second housing component 52 is a plastic part. In some embodiments, a hardness of the first housing component 51 is greater than a hardness of the second housing component 52. In some embodiments, the second housing component 52 can be affixed to the first housing component 51 by one or more screws or other types of fasteners.

Figure 3:
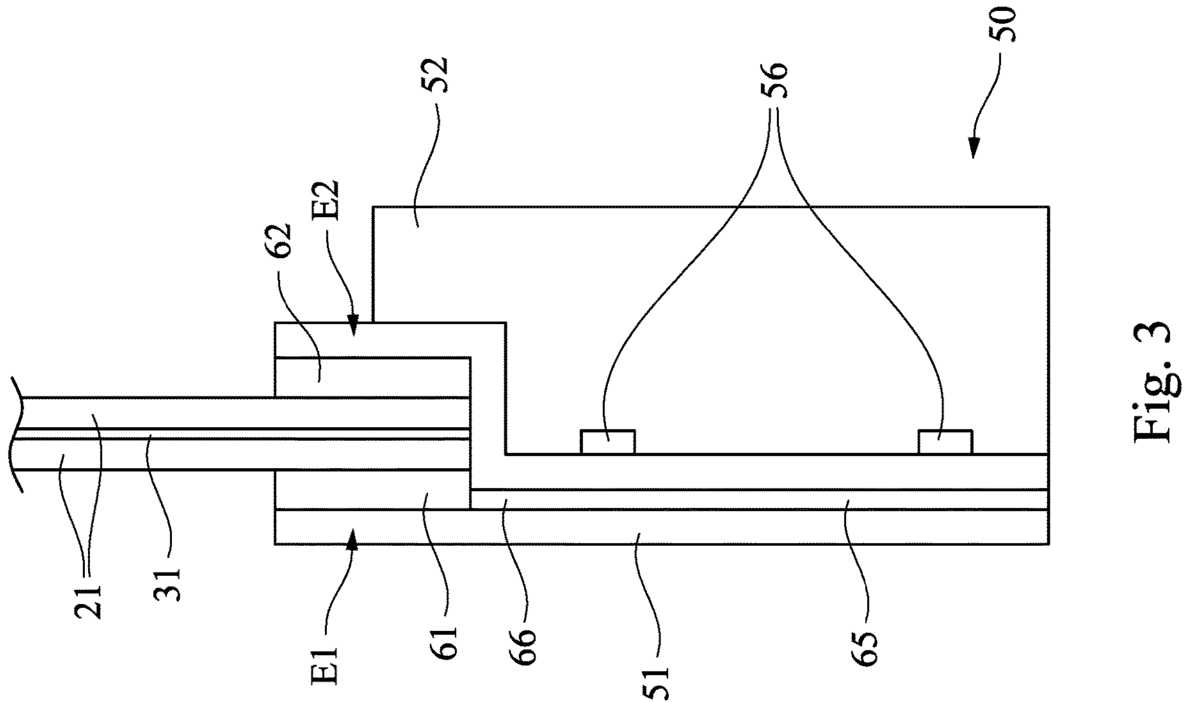
FIG. 3 illustrates a schematic side view of some components of the vehicle window assembly shown in FIG. 1.

Reference is made additionally to FIG. 3. FIG. 3 illustrates a schematic side view of the glass cover plates 21, the display component 31 and the waterproof case 50 of the vehicle window assembly 12 shown in FIG. 1 (i.e., a side view that can be observed when the bracket 40 is removed). As shown in FIGS. 1-3, in some embodiments, the first housing component 51 has an upper edge E1 and the second housing component 52 has an upper edge E2. The upper edges E1 and E2 are located on two opposite sides of the glass cover plates 21 and clamp the lower edge 23 of the glass cover plates 21.

As shown in FIGS. 1-3, in some embodiments, the waterproof case 50 further includes a first double-sided adhesive strip 61 and a second double-sided adhesive strip 62, both having waterproof character. The first double-sided adhesive strip 61 and the second double-sided adhesive strip 62 are arranged along the lower edge 23 of the glass cover plates 21 and are located on two opposite sides of the glass cover plates 21. The first double-sided adhesive strip 61 adheres between the upper edge E1 of the first housing component 51 and the one of the glass cover plates 21. In other words, the two opposite surfaces of the first double-sided adhesive strip 61 adhere to the first housing component 51 and one of the glass cover plates 21, respectively. The second double-sided adhesive strip 62 adheres between the upper edge E2 of the second housing component 52 and the other glass cover plate 21. In other words, the two opposite surfaces of the second double-sided adhesive strip 62 adhere to the second housing component 52 and the other glass cover plate 21, respectively. With the addition of the first double-sided adhesive strip 61 and the second double-sided adhesive strip 62, waterproof capability of the waterproof case 50 can be improved (for example, the double-sided adhesive strips can compensate for possible insufficient flatness of the first housing component 51 and the second housing component 52 due to limitations of mechanical manufacturing processes). Specifically, if there exists a gap between the first housing component 51 and the second housing component 52, the first double-sided adhesive strip 61 and the second double-sided adhesive strip 62 can prevent water from entering the waterproof case 50 through the gap, and thus can prevent short-circuiting condition of the circuit board 35 or the flexible circuit board 34 in the waterproof case 50.

As shown in FIGS. 1-3, in some embodiments, the waterproof case 50 further includes at least one fastener 56 (e.g., at least one screw). The second housing component 52 is affixed to the first housing component 51 by the fastener 56, such that the first double-sided adhesive strip 61 is pressed between the first housing component 51 and the glass cover plates 21, and that the second double-sided adhesive strip 62 is pressed between the second housing component 52 and the glass cover plates 21. By this arrangement, the waterproof case 50 can have improved water tightness to block water from entering the waterproof case 50.

As shown in FIGS. 1-3, in some embodiments, the waterproof case 50 further includes one or more waterproof sealing strips 65. The waterproof sealing strips 65 are arranged along the lateral sides of the first housing component 51 and the lateral sides of the second housing component 52. Each of the waterproof sealing strips 65 has two opposite surfaces abutting against the first housing component 51 and the second housing component 52, respectively. By this arrangement, when there exists a gap on the lateral sides the waterproof case 50, the waterproof sealing strips 65 can prevent water from leaking into the waterproof case 50 through the gap.

As shown in FIGS. 1-3, in some embodiments, the fastener 56 extends through the second housing component 52 and a respective waterproof sealing strip 65, and the fastener 56 is fixedly coupled to the first housing component 51. Specifically, the first housing component 51 has at least one through-hole 57, the second housing component 52 has at least one through-hole 58, and the waterproof sealing strip 65 has at least one through-hole 64. The through-holes 57, 58 and 64 are provided at corresponding locations. The through-hole 58 is provided on a flange of the second housing component 52. The fastener 56 extends through the through-hole 58 of the second housing component 52 and the through-hole hole 64 of the waterproof sealing strip 65 in order, and is fixedly inserted in the through-hole 57 of the first housing component 51 (the through-hole 57 may include an internal thread that can mate with the fastener 56). By this arrangement, the first housing component 51 and the second housing component 52 can clamp and press the waterproof sealing strips 65 to make it more difficult for water to leak into the waterproof case 50.

In some embodiments, the waterproof sealing strips 65 can include double-sided adhesive strips, and the waterproof sealing strips 65 can adhere between the first housing component 51 and the second housing component 52. In other words, the two opposite surfaces of each waterproof sealing strip 65 adhere to the first housing component 51 and the second housing component 52, respectively. In other embodiments, the waterproof sealing strips 65 may include a resin material.

In some embodiments, stiffness of the waterproof sealing strips 65 is less than the stiffness of the first housing component 51 and the stiffness of the second housing component 52. By this arrangement, the waterproof sealing strips 65 can more easily deform when being pressed by the first housing component 51 and the second housing component 52. Accordingly, the waterproof sealing strips 65 can closely mate with the first housing component 51 and the second housing component 52. In some embodiments, stiffness of the first double-sided adhesive strip 61/the second double-sided adhesive strip 62 is less than the stiffness of the first housing component 51 and the stiffness of the second housing component 52.

As shown in FIGS. 1-3, in some embodiments, terminal ends of the waterproof sealing strips 65 are joined with at least one of the first double-sided adhesive strip 61 and the second double-sided adhesive strip 62, so as to prevent water from leaking through a gap between the waterproof sealing strips 65 and the first double-sided adhesive strip 61 or the second double-sided adhesive strip 62. In the illustrated embodiment, upper ends 66 of the two waterproof sealing strips 65 are joined with (e.g., make contact with) the first double-sided adhesive strip 61 (also refer to FIG. 6), such that the two waterproof sealing strips 65 and the first double-sided adhesive strip 61 form an inverted U-shaped structure. Such can prevent water flowing down the glass cover plates 21 from leaking into the waterproof case 50 from the top or the lateral sides of the waterproof case 50.

Figure 4:
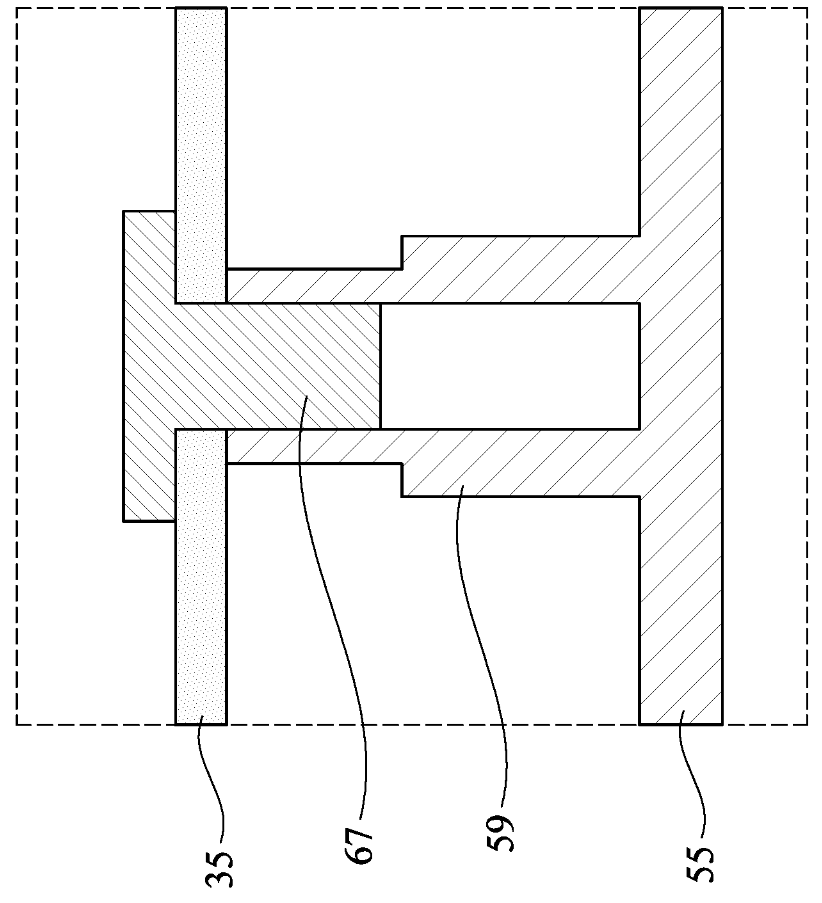
FIG. 4 illustrates a cross-sectional view of the vehicle window assembly shown in FIG. 2 taken along line segment 4-4'.

Reference is made additionally to FIG. 4. FIG. 4 illustrates a cross-sectional view of the vehicle window assembly 12 shown in FIG. 2 taken along line segment 4-4'. As shown in FIGS. 2 and 4, in some embodiments, the first housing component 51 includes a backplate 55 and at least one boss 59. The boss 59 is disposed on the backplate 55 and projects from the backplate 55. The vehicle window assembly further includes at least one fastener 67 extending through the circuit board 35 and fixing the circuit board 35 to the boss 59 of the first housing component 51. By this arrangement, the flexible circuit board 34 connected to the circuit board 35 can be prevented from being damaged by vibrations that occur during vehicle operation. For example, excessive pulling between the flexible circuit board 34 and the display driver IC 33 (which is in the form of COF package) caused by the vibrations is eliminated, and as a result, bonding failure between the flexible circuit board 34 and the display driver IC 33 is prevented.

In some embodiments, the fastener 67 includes a screw, and the boss 59 has a threaded hole configured to mate with the screw. In some embodiments, the circuit board 35 can be affixed to the first housing component 51 at multiple points. Specifically, the first housing component 51 can include a plurality of bosses 59, and the vehicle window assembly 12 can include a plurality of fasteners 67, each affixed to a respective boss 59. In some embodiments, the bosses 59 and the fasteners 67 are provided at the corners and the center of the circuit board 35.

Figure 5:
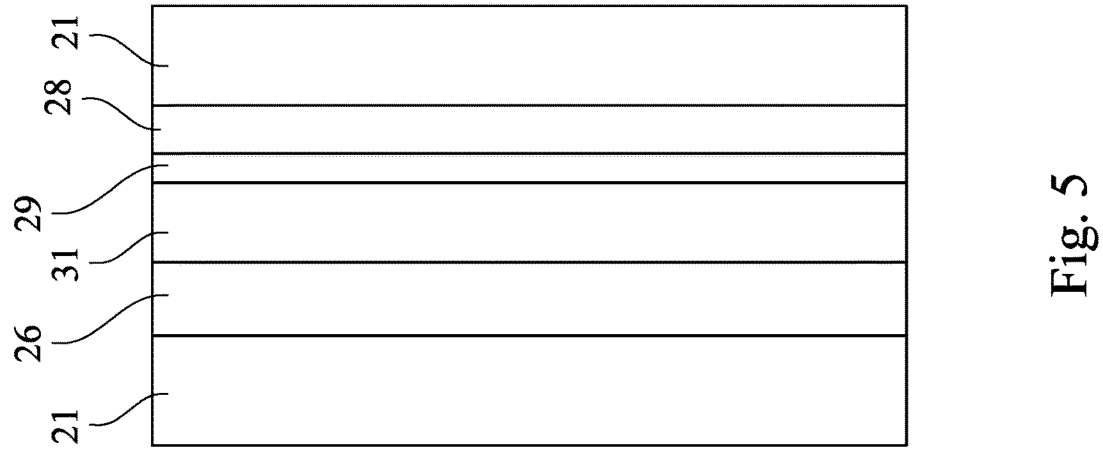
FIG. 5 illustrates a cross-sectional view of the vehicle window assembly shown in FIG. 2 taken along line segment 5-5'.

Reference is made to FIG. 5. FIG. 5 illustrates a cross-sectional view of the vehicle window assembly 12 shown in FIG. 2 taken along line segment 5-5'. In some embodiments, the display panel 30 can be a transparent or semi-transparent display panel, i.e., the display component 31 of the display panel 30 can be transparent or semi-transparent (e.g., the display component 31 can include a transparent or semi-transparent substrate, such as a glass substrate). In some embodiments, the display panel 30 can be a flexible display panel, i.e., the display component 31 of the display panel 30 can be flexible (e.g., the display component 31 can include a flexible substrate; the flexible substrate can include material such as polyimide (PI), polyethylene terephthalate (PET) or polymethyl methacrylate (PMMA)). In some embodiments, the vehicle window assembly 12 can further include a touch sensing module (not depicted) to provide touch function. The touch sensing module can be positioned between the two glass cover plates 21 and face the display component 31.

As shown in FIG. 5 in some embodiments, the vehicle window assembly 12 further includes a molding film 29. The molding film 29 is a transparent film that is disposed on a side of the display component 31 and is configured to cover the display component 31. For example, in cases where the display panel 30 is a microLED display panel, the molding film 29 can cover the microLED array of the display component 31. In some embodiments, the vehicle window assembly 12 further includes two laminating adhesive layers 26 and 28. The laminating adhesive layer 26 is provided between the display component 31 and one of the glass cover plates 21, whereas the laminating adhesive layer 28 is provided between the display component 31 and the other glass cover plate 21. The laminating adhesive layers 26 and 28 can provide anti-scattering function. When the glass cover plates 21 break, the glass chips would stick to the laminating adhesive layers 26 and 28. The laminating adhesive layers 26 and 28 can include polyvinyl butyral (PVB) or other suitable resin materials. The laminating adhesive layers 26 and 28 can also include optically clear adhesive (OCA) to achieve higher transmittance.

Figure 6:
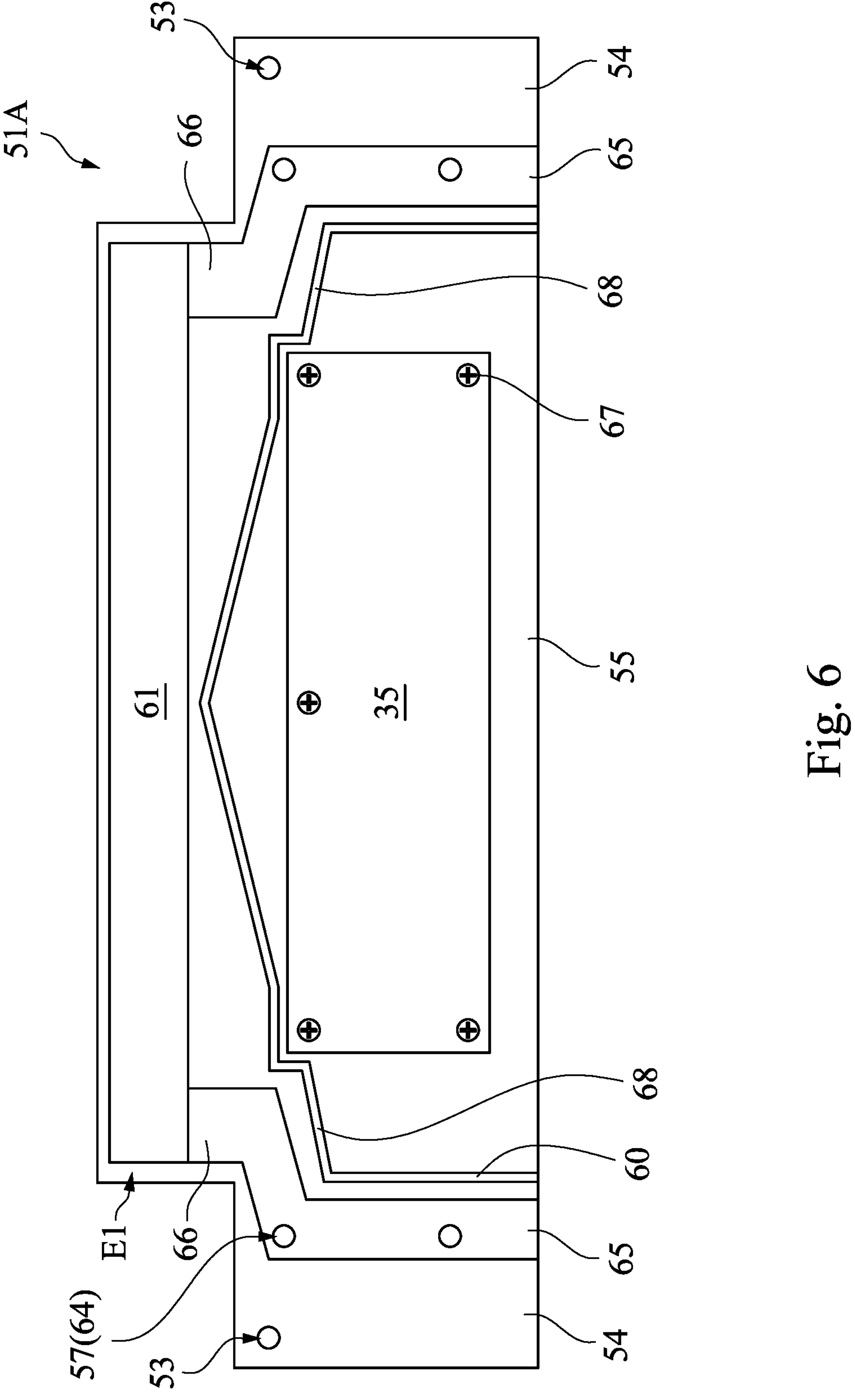
FIG. 6 illustrates a schematic front view of a first housing component of a waterproof case in accordance with another embodiment of the present disclosure, in which a circuit board of a display panel is mounted on the first housing component.

Reference is made to FIG. 6. FIG. 6 illustrates a schematic front view of a first housing component 51A of a waterproof case in accordance with another embodiment of the present disclosure, in which a circuit board 35 of a display panel is mounted on the first housing component 51A. In some embodiments, the first housing component 51A includes at least one partition wall 60. The partition wall 60 is disposed on the backplate 55 and projects from the backplate 55. The partition wall 60 is disposed on an inner side of the waterproof sealing strip 65, and the partition wall 60 has an end surface that abuts against a second housing component of the waterproof case (e.g., the second housing component 52 mentioned above), such that the partition wall 60 separates the waterproof sealing strip 65 and the circuit board 35. The partition wall 60 may also partially extend to the lowered side of the first double-sided adhesive strip 61 and a second double-sided adhesive strip (e.g., the second double-sided adhesive strip 62 mentioned above), such that the partition wall 60 separates the circuit board 35 and the first double-sided adhesive strip 61, or separates the circuit board 35 and the second double-sided adhesive strip. By this arrangement, even if the first double-sided adhesive strip 61, the second double-sided adhesive strip or the waterproof sealing strips 65 fail to block all water, a small amount of water that passes through the first double-sided adhesive strip 61, the second double-sided adhesive strip or the waterproof sealing strips 65 would be blocked by the partition wall 60 and thus would not contact the circuit board 35.

As shown in FIG. 6, in some embodiments, the partition wall 60 has at least one sloping edge 68 tilting away from the circuit board 35. By this arrangement, the partition wall 60 can remove the water leaking into the waterproof case and avoid accumulation of water in the waterproof case.

In sum, the vehicle window assembly of the present disclosure includes a display panel to provide display function. The display panel is covered by two glass cover plates, and the display panel includes a circuit board exposed outside the glass cover plates and enclosed by a waterproof case. The waterproof case is supported by at least one bracket fixedly clamping a lower edge of the glass cover plates. By this arrangement, the vehicle window assembly of the present disclosure can be compliant with the waterproof requirement of automotive electronics. In addition, the circuit board can be fixed in the waterproof case to restrict the movement of the circuit board. Such can prevent a flexible circuit board connected to the circuit board from being damaged by vibrations that occur during vehicle operation.

Although the present disclosure has been described by way of the exemplary embodiments above, the present disclosure is not to be limited to those embodiments. Any person skilled in the art can make various changes and modifications without departing from the spirit and the scope of the present disclosure. Therefore, the protective scope of the present disclosure shall be the scope of the claims as attached.

What is claimed is:

1. A vehicle window assembly, comprising:

two glass cover plates;

a display panel comprising a display component and a circuit board, wherein the display component is positioned between the two glass cover plates, the circuit board is connected to the display component and is at least partially exposed outside the two glass cover plates;

at least one bracket fixedly clamping a lower edge of each of the two glass cover plates; and a waterproof case fixedly attached to the at least one bracket and comprising a first housing component and a second housing component, wherein the first housing component and the second housing component are tightly combined and enclose the circuit board.

2. The vehicle window assembly of claim 1, wherein the first housing component and the second housing component each have an upper edge, the upper edge of the first housing component and the upper edge of the second housing component clamp the lower edge of the two glass cover plates.

3. The vehicle window assembly of claim 2, wherein the waterproof case further comprises a first double-sided adhesive strip and a second double-sided adhesive strip, both of which are arranged along the lower edge of the two glass cover plates, wherein the first double-sided adhesive strip adheres between the upper edge of the first housing component and the two glass cover plates, and the second double-sided adhesive strip adheres between the upper edge of the second housing component and the two glass cover plates.

4. The vehicle window assembly of claim 3, wherein the waterproof case further comprises a fastener, the second housing component is affixed to the first housing component by the fastener, such that the first double-sided adhesive strip is pressed between the first housing component and the two glass cover plates, and the second double-sided adhesive strip is pressed between the second housing component and the two glass cover plates.

5. The vehicle window assembly of claim 1, wherein the waterproof case further comprises at least one waterproof sealing strip, the at least one waterproof sealing strip is arranged along at least one lateral side of the first housing component, and the at least one waterproof sealing strip has two opposite surfaces abutting against the first housing component and the second housing component, respectively.

6. The vehicle window assembly of claim 5, wherein the waterproof case further comprises a fastener, the fastener extends through the second housing component and the at least one waterproof sealing strip, and the fastener is fixedly coupled to the first housing component.

7. The vehicle window assembly of claim 5, wherein the first housing component comprises at least one partition wall, the at least one partition wall is disposed on an inner side of the at least one waterproof sealing strip and separates the at least one waterproof sealing strip and the circuit board.

8. The vehicle window assembly of claim 7, wherein the at least one partition wall has a sloping edge tilting away from the circuit board.

9. The vehicle window assembly of claim 5, wherein the at least one waterproof sealing strip comprises at least one double-sided adhesive strip.

10. The vehicle window assembly of claim 1, wherein the first housing component comprises a backplate and a boss, the boss is disposed on the backplate and projects from the backplate, wherein the vehicle window assembly further comprises a fastener extending through the circuit board and fixing the circuit board to the boss.

11. The vehicle window assembly of claim 1, wherein a stiffness of the first housing component is greater than a stiffness of the second housing component, and the first housing component is affixed to the at least one bracket.

12. The vehicle window assembly of claim 1, wherein the at least one bracket comprises two brackets, the two brackets are spaced apart from each other, the waterproof case is positioned between the two brackets and is fixedly attached to the two brackets.

13. The vehicle window assembly of claim 1, wherein the at least one bracket has a groove, the two glass cover plates are inserted in the groove of the at least one bracket and clamped by the at least one bracket.

14. A vehicle window assembly, comprising:

two glass cover plates;

a display panel comprising a display component, a circuit board and a flexible circuit board, wherein the display component is positioned between the two glass cover plates, the circuit board is connected to a lower edge of the display component via the flexible circuit board, the circuit board and the flexible circuit board are at least partially exposed outside the two glass cover plates;

two brackets fixedly clamping a lower edge of each of the two glass cover plates and spaced apart from each other; and a waterproof case positioned between the two brackets and fixedly attached to the two brackets, wherein the waterproof case comprises a first housing component and a second housing component, the first housing component and the second housing component are tightly combined and enclose the circuit board and the flexible circuit board, wherein the first housing component and the second housing component each have an upper edge, the upper edge of the first housing component and the upper edge of the second housing component clamp the lower edge of each of the two glass cover plates.

15. The vehicle window assembly of claim 14, wherein the waterproof case further comprises a first double-sided adhesive strip and a second double-sided adhesive strip, both of which are arranged along the lower edge of the two glass cover plates, wherein the first double-sided adhesive strip adheres between the upper edge of the first housing component and the two glass cover plates, and the second double-sided adhesive strip adheres between the upper edge of the second housing component and the two glass cover plates.

16. The vehicle window assembly of claim 14, wherein the waterproof case further comprises at least one waterproof sealing strip, the at least one waterproof sealing strip is arranged along at least one lateral side of the first housing component, and the at least one waterproof sealing strip has two opposite surfaces abutting against the first housing component and the second housing component, respectively.

17. The vehicle window assembly of claim 14, wherein the first housing component comprises a backplate and a boss, the boss is disposed on the backplate and projects from the backplate, wherein the vehicle window assembly further comprises a fastener extending through the circuit board and fixing the circuit board to the boss.

18. The vehicle window assembly of claim 14, wherein the two brackets each have a groove, the two glass cover plates are inserted in the groove of each of the two brackets and clamped by the two brackets.

19. A vehicle window assembly, comprising:

two glass cover plates;

a display panel comprising a display component and a circuit board, wherein the display component is positioned between the two glass cover plates, the circuit board is connected to the display component and is at least partially exposed outside the two glass cover plates;

at least one bracket fixedly clamping a lower edge of each of the two glass cover plates; and a waterproof case fixedly attached to the at least one bracket and comprising a first housing component and a second housing component, wherein the first housing component and the second housing component are tightly combined and enclose the circuit board, wherein an upper edge of the first housing component and an upper edge of the second housing component are located on two opposite sides of the two glass cover plates and clamp the lower edge of each of the two glass cover plates.

20. The vehicle window assembly of claim 19, wherein the at least one bracket has a groove, the two glass cover plates are inserted in the groove of the at least one bracket and clamped by the at least one bracket.

* * * * *